(12) United States Patent
Wu et al.

(10) Patent No.: US 7,498,883 B2
(45) Date of Patent: Mar. 3, 2009

(54) DISTRIBUTED AMPLIFIER WITH BUILT-IN FILTERING FUNCTIONS

(75) Inventors: Hui Wu, Pittsford, NY (US); Yunliang Zhu, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 11/544,937

(22) Filed: Oct. 10, 2006

(65) Prior Publication Data

US 2007/0182481 A1    Aug. 9, 2007

Related U.S. Application Data

(60) Provisional application No. 60/724,304, filed on Oct. 7, 2005.

(51) Int. Cl.
*H03F 3/60* (2006.01)
(52) U.S. Cl. .................................. 330/286; 330/295
(58) Field of Classification Search ................ 330/53, 330/84, 124 R, 126, 286, 295
See application file for complete search history.

(56) References Cited

U.S. PATENT DOCUMENTS

| 4,374,369 | A |   | 2/1983  | Sakamoto |
|---|---|---|---|---|
| 4,785,270 | A |   | 11/1988 | Kinsman |
| 4,808,938 | A |   | 2/1989  | Levinson |
| 5,027,084 | A | * | 6/1991  | Tsukii ........................ 330/295 |
| 5,227,734 | A | * | 7/1993  | Schindler et al. ............... 330/54 |
| 5,732,106 | A |   | 3/1998  | Rasmussen et al. |
| 6,201,457 | B1 |  | 3/2001  | Hickernell |
| 6,455,788 | B2 |  | 9/2002  | Hughes et al. |
| 6,686,754 | B2 |  | 2/2004  | Miller |
| 6,946,912 | B2 | * | 9/2005 | Retelny, Jr. ................. 330/296 |
| 2004/0202311 | A1 | | 10/2004 | Zhao et al. |

FOREIGN PATENT DOCUMENTS

| JP | 06-124168 | 5/1994 |
|---|---|---|
| JP | 2003-059189 | 2/2003 |
| JP | 2003-061045 | 2/2003 |
| WO | WO-95/16990 | 6/1995 |

* cited by examiner

*Primary Examiner*—Henry K Choe
(74) *Attorney, Agent, or Firm*—Blank Rome LLP

(57) ABSTRACT

A distributed amplifier uses non-uniform filtering structures to provide better control over pass-band and stop-band characteristics. The various sections can have different tap coefficients. A notch filter can be implemented for interference suppression or pulse shaping in an ultra-wideband transceiver.

19 Claims, 17 Drawing Sheets

DISTRIBUTED AMPLIFIER WITH BUILT-IN FILTERING FUNCTIONS

REFERENCE TO RELATED APPLICATION

The present application claims the benefit of U.S. Provisional Patent Application No. 60/724,304, filed Oct. 7, 2005, whose disclosure is hereby incorporated by reference in its entirety into the present disclosure.

FIELD OF THE INVENTION

The present invention is directed to a distributed amplifier and more specifically to a distributed amplifier whose spectrum is tailored according to a specified frequency response.

DESCRIPTION OF RELATED ART

Rapid progress in wideband communications, such as ultra wideband (UWB) and fiber-optic systems, are driving demands for front-end amplifiers with multi-gigahertz bandwidth. UWB is a very low power wireless technology in which data is transmitted in short duration (nanosecond) pulses rather than a sine-wave RF carrier, as in existing wireless. It can support high-speed high content data transfer over short ranges and would be applied in wireless personal area networks (WPAN) for computing, industrial automation and home entertainment appliances.

Distributed amplifiers (DAs) have always been one of the top choices for wideband amplification. Recently, advances in silicon technologies make it possible to build fully-integrated CMOS DAs with multi-GHz bandwidth, which are very attractive because of silicon's low cost and integration capability with baseband circuits.

Not surprisingly, most of these research efforts focus on achieving large bandwidth, which means that the design usually addresses only the passband characteristics of a DA's frequency response. On the other hand, wideband systems increasingly require good out-of-band spectrum control to reject interference and reduce noise. For example, in impulse radio UWB systems, there are very stringent requirements on the signal spectrum due to concerns of interference with existing wireless services. Therefore, tighter control over the overall DA frequency response is needed, and good stopband characteristic is highly desirable. This is particularly important for CMOS DAs since they tend to have a slow slope in the stop-band due to the lossy on-chip transmission lines.

Impulse radio UWB (IR-UWB) has great potential in low data-rate wireless communications such as sensor networks because of its promised low circuit complexity, low power consumption, and location capability. Most impulse radios demonstrated so far, however, have yet to use the whole spectrum available (3.1-10.7 GHz), and hence do not take full advantage of the processing gain of spread spectrum. This is largely due to the interference issues between UWB systems and existing narrow-band wireless communications, such as 802.11b/g at 2.4 GHz and 802.11a at 5 GHz.

An all-digital architecture would be ideal for maximum reconfigurability and scalability for the system and would enable digital FIR filters to be used for interference suppression and pulse shaping. But it requires ultra-high-speed analog-to-digital converters (ADC) and other digital signal processing (DSP) circuitry such as matched filters, which results in high circuit complexity and large power consumption. Hence it will largely defeat the purpose of using IR-UWB in low-rate applications.

SUMMARY OF THE INVENTION

It is therefore an object of the invention to provide improved frequency response in a DA.

To achieve the above and other objects, non-uniform filtering structures can be used in DAs for better control of the frequency response in both pass-band and stop-band. Prototype DAs with Butterworth and Chebyshev filtering designed and implemented using a 0.18 μm digital CMOS technology. Measurement results verified the new design concept.

The invention provides a new design concept for DAs: by synthesizing the (artificial) transmission lines as nonuniform filters with specific frequency response. In that manner, the DA's spectrum can be controlled not only within the passband, but also in the stop-band.

One preferred embodiment provides distributed transversal filters (DTF) for pulse shaping and narrow-band interference suppression at IR-UWB front-end. This solution can enable the full UWB spectrum to be utilized to achieve significantly larger processing gain than current systems. A 7-tap DTF prototype has been designed and fabricated using a 0.18 μm BiCMOS technology. Initial measurement results successfully demonstrated its capability for pulse shaping and interference suppression in IR-UWB pulses.

In order to overcome the interference hurdle, pulse shaping is needed in UWB transmitters, and so is narrow-band interference (NBI) suppression in receivers. Both functions can be implemented in either analog or digital domain depending on the transceiver architecture.

BRIEF DESCRIPTION OF THE DRAWINGS

Preferred embodiments of the present invention will be set forth in detail with reference to the drawings, in which.

DETAILED DESCRIPTION OF THE PREFERRED EMBODIMENTS

Figure 1:
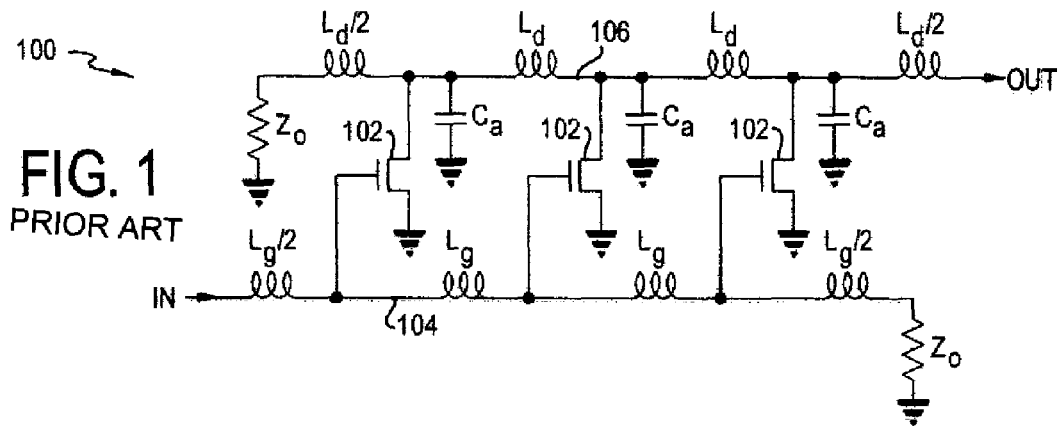
FIG. 1 is a circuit diagram showing a conventional constant-k DA.

Preferred embodiments of the present invention will be set forth in detail with reference to the drawings, in which like reference numerals refer to like elements throughout.

A amplifier according to a first preferred embodiment will now be explained.

Conventional DAs usually use constant-k sections as the basic iterative structures in the gate and drain lines, and hence the latter become uniform (artificial) transmission lines. As shown in FIG. 1, a conventional DA 100 uses a ladder-like arrangement of amplifier elements 102 between a gate line 104 and a drain line 106. M-derived sections are usually used at terminations to improve matching. Although widely adopted, constant-k sections are only one of the possible filtering structures in distributed amplifiers. The necessary condition for distributed amplification is that the signals traveling in the forward direction add in-phase, and those traveling in the reverse direction are absorbed by terminations. Therefore, non-uniform filtering structures may also be used for transmission lines in the DA design.

Figure 2A:
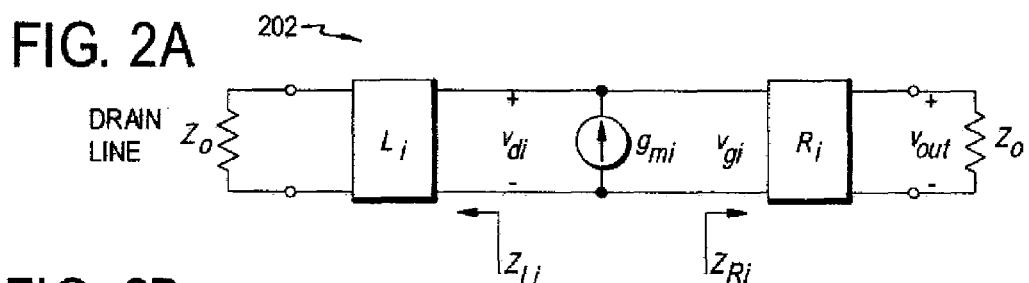
FIGS. 2A and 2B are block diagrams of a model of a DA with non-uniform filtering structures.

Can the phase synchronization be maintained if we use a non-uniform filtering structure in a distributed amplifier? To answer this question, we analyze a DA with lossless nonuniform filtering structures, and ideal transistors (unilateral and no parasitic resistance), as shown in FIG. 2A with respect to the drain line 206 and in FIG. 2A with respect to the gate line 204. We are concerned only about the signal flowing through the i-th tap, and hence only its gate-line voltage and transconductance is shown. The other parts of gate and drains lines are separated into the left block $L_i$ and right block $R_i$. We define the impedance looking into the two directions as $Z_{Li}$ and $Z_{Ri}$. The voltage transfer from the gate line to the drain line at this tap is $$\frac{v_{di}}{v_{gi}} = \frac{g_{mi}}{Y_{Li} + Y_{Ri}}$$

where $Y_{Li}=1/Z_{Li}$, $Y_{Ri}=1/Z_{Ri}$, and $g_{mi}$ is the transistor transconductance. Signals on gate line and drain line are in synchronization if the right-hand side of the above equation is a real number, i.e., $Im\{Y_{Li}\}+Im\{Y_{Ri}\}=0$.

Figure 2B:
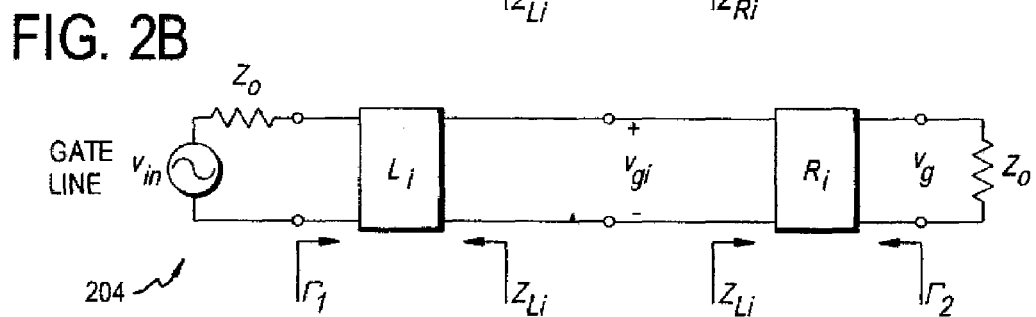

It can be shown that for a lossless passive network split into two parts like that of FIG. 2, $$\left|\frac{Z^*_{Li} - Z_{Ri}}{Z_{Li} + Z_{Ri}}\right| = |\Gamma_1| = |\Gamma_2|$$

when $\Gamma_1=\Gamma_2=0$, $Z^*_{Li}=Z_{Ri}$ or $Y^*_{Li}=Y_{Ri}$. Therefore, the synchronization requirement is satisfied within the passband, given that both transmission lines are matched at terminations ($\Gamma_1=\Gamma_2=0$). Note that the phase synchronization condition above implies maximum power transfer in the pass-band, but is generally not satisfied in the stop-band, which usually helps the stop-band performance.

Figure 3A:
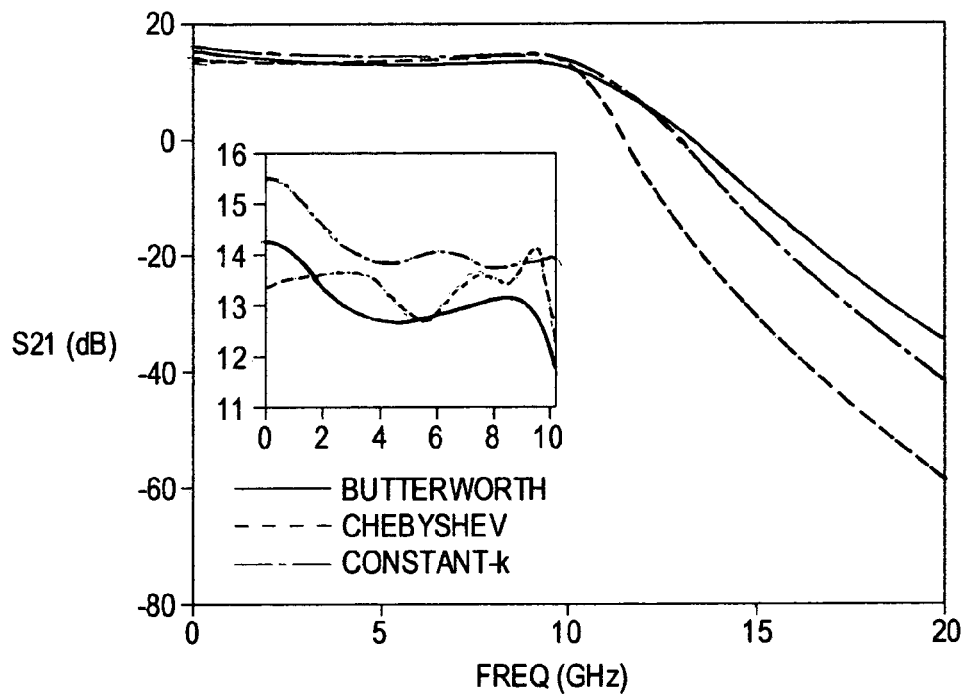
FIGS. 3A and 3B are plots showing a comparison of DAs with different filtering structures.
Figure 3B:
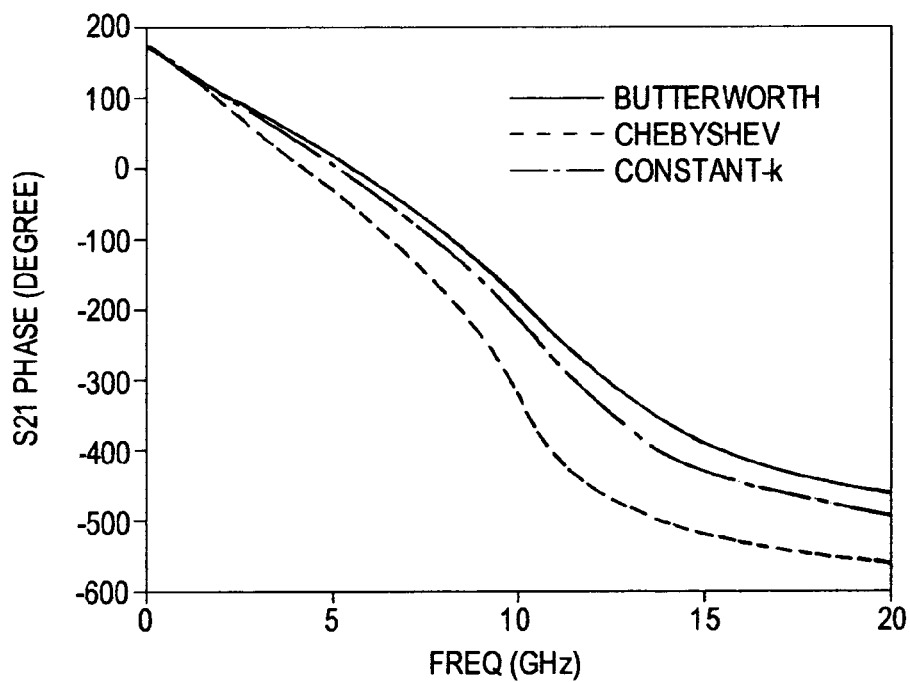

In the prototypes of the first preferred embodiment reported below, the filtering structures of the gate-line and drain-line are constructed as Butterworth and Chebyshev functions since both are common low-pass filters used in microwave applications. It is expected that given the same bandwidth, the Butterworth one is quite close to the conventional constant-k case, with flat response within the passband, while the Chebyshev one shows faster roll-off in the stop-band, but its phase response is less linear. The magnitude and phase responses are shown in FIGS. 3A and 3B, respectively.

Figure 4A:
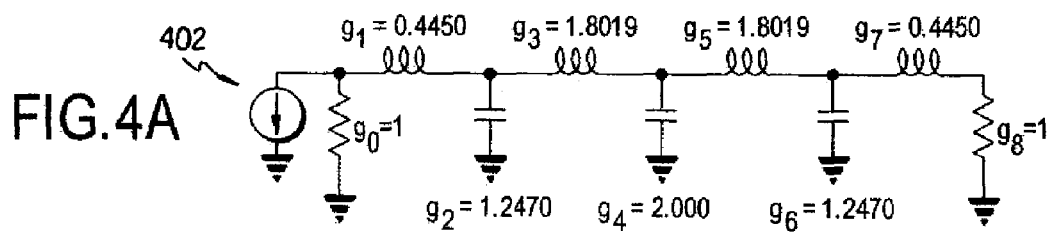
FIGS. 4A and 4B are diagrams showing normalized design parameters for two variations of the first preferred embodiment.
Figure 4B:
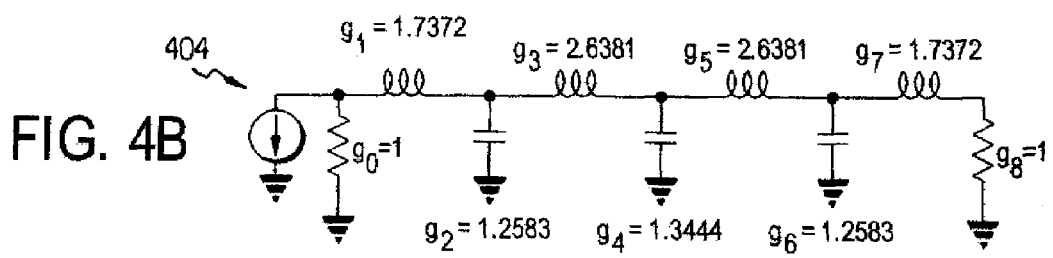

We chose three-stage designs for the prototype DAs, which are typical for CMOS DAs. So the order of corresponding filters is determined to be seven. The network synthesis method is used to generate the initial design. The normalized design parameters of an LC ladder structure, beginning with a series element, for low-pass Butterworth and Chebyshev filtering, are shown in FIGS. 4A and 4B for the Butterworth variant 402 and the Chebyshev variant 404, respectively. The real inductance and capacitance values can be scaled from the normalized filter parameters:

$$L_k = \frac{Z_0 g_k}{\omega_c}$$

$$C_k = \frac{g_k}{Z_0 \omega_c}$$

where $L_k$ and $C_k$ are the physical inductance and capacitance values in the ladder structure, $Z_0$ is the characteristic impedance, $\omega_c$ is the cutoff frequency, and $g_k$ is the normalized design parameter in FIGS. 4A and 4B.

Figure 5:
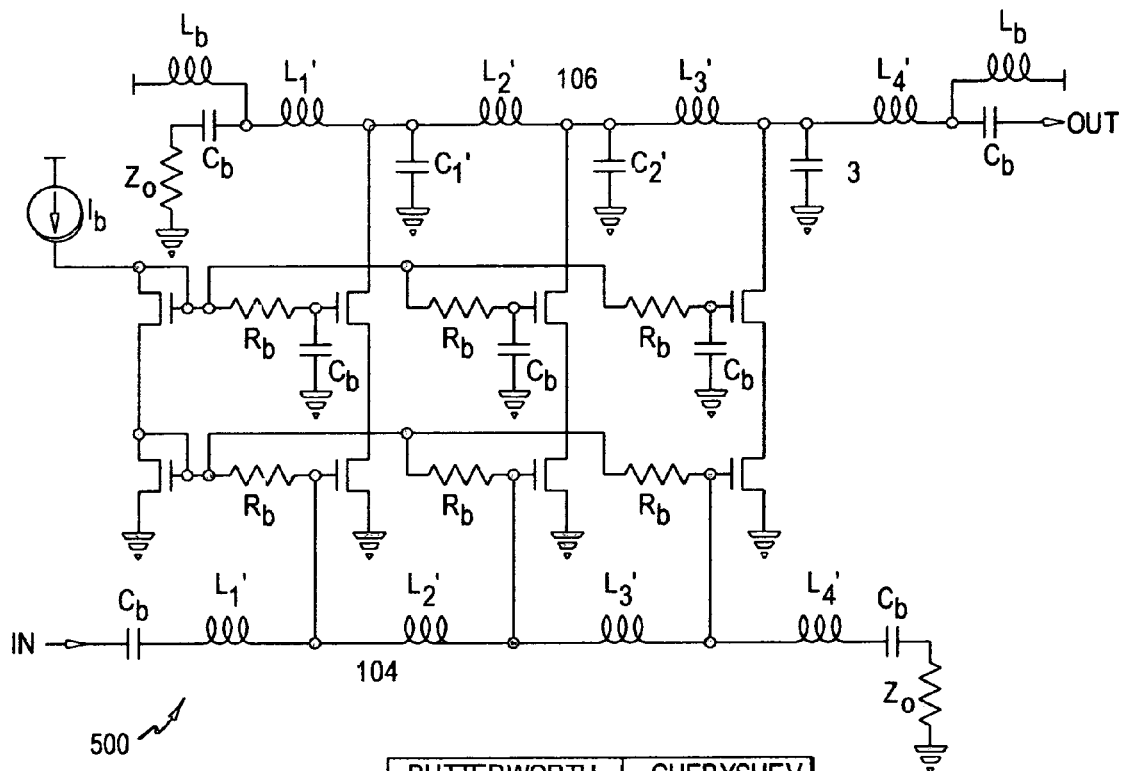
FIG. 5 is a circuit schematic showing the first preferred embodiment.

The schematic of the prototype DA's is shown in FIG. 5 as 500. The cutoff frequency $f_c=\omega_c/2\pi$ of both the gate and the drain lines is specified to be 10 GHz. The characteristic impedance $Z_0$ of both the gate and the drain lines is 50Ω. In this schematic, inductors $L'_k=L_k$, while on the gate line the input capacitance of each gain cell is designed to be $C_k$. On the drain line, extra shunt capacitors $C'_k$ are added with output capacitance of each stage to form $C_k$. The inductance and capacitance values for Butterworth and Chebyshev filtering are listed in the inset table of FIG. 5.

A cascode configuration is chosen for the gain cell because of its large output impedance and wideband frequency response. A cascode current mirror provides dc bias. $L_b$ and $C_b$ represent the bias tees and dc blocks in the test set-up. Off-chip wideband 50Ω terminations are used in the measurement.

The inductors are initially designed using Asitic to optimize for Q. Then the area of inductors is minimized to reduce the parasitic capacitance, which is important to maintain the constant inductance value within the pass-band. Then the complete gate and drain lines are simulated in Sonnet to generate wideband s-parameters for circuit simulation.

The prototype DAs were fabricated using National Semiconductor's 0.18 μm digital CMOS technology with bulk silicon substrate. Spiral inductors are constructed using the 2 μm thick bump metal layer. The design rule on this metal layer results in low self-resonance frequency for the spiral inductors, and hence limited the achievable bandwidth of the prototype DAs.

Figure 6A:
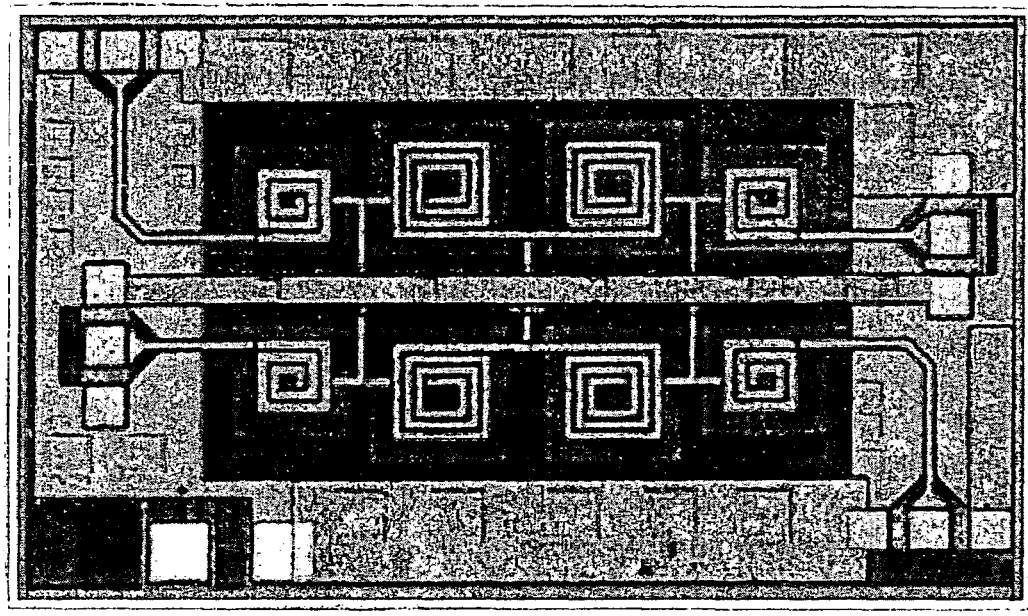
FIGS. 6A and 6B are chip micrographs of prototypes of the two variations of the first preferred embodiment.
Figure 6B:
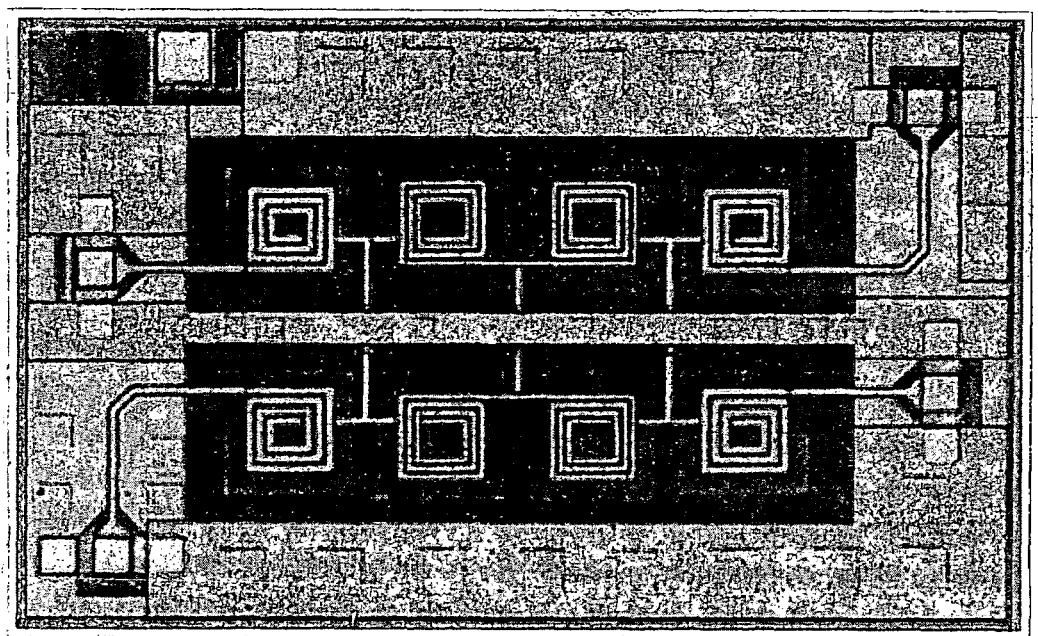

The chip photos are shown in FIGS. 6A and 6B for the Butterworth variant 602 and the Chebyshev variant 604, respectively. The chip size is 1.6 mm×0.9 mm for the Butterworth one and 1.8 mm×1.1 mm for the Chebyshev one. The power supply is 1.5 V for both DAs. The power consumption is 51 mW and 54 mW for the Butterworth and Chebyshev DAs, respectively.

Figure 7A:
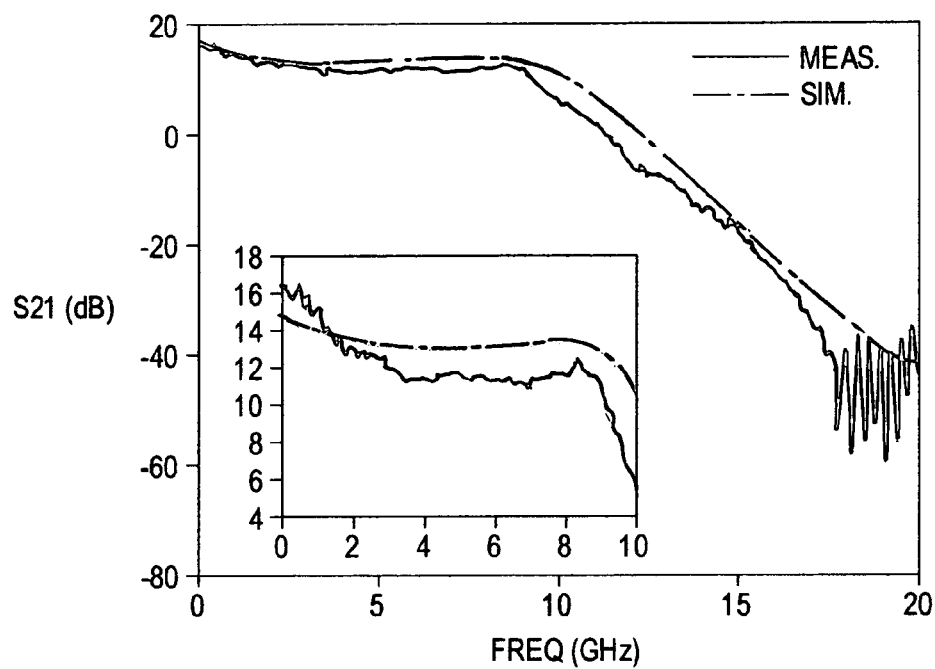
FIGS. 7A-7D are plots showing measured performance of the prototype of FIG. 6A.
Figure 7B:
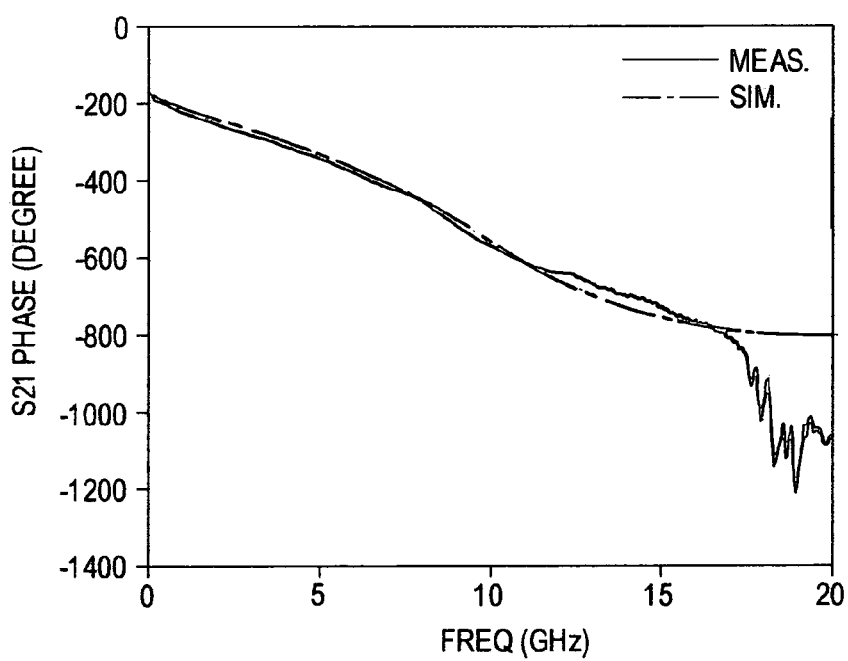
Figure 7C:
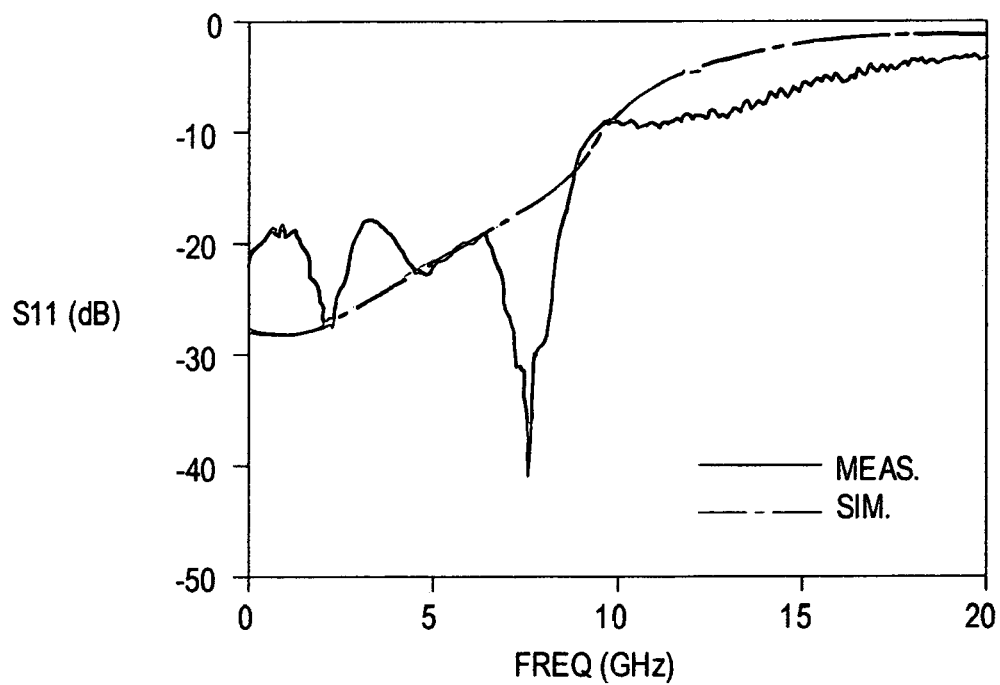
Figure 7D:
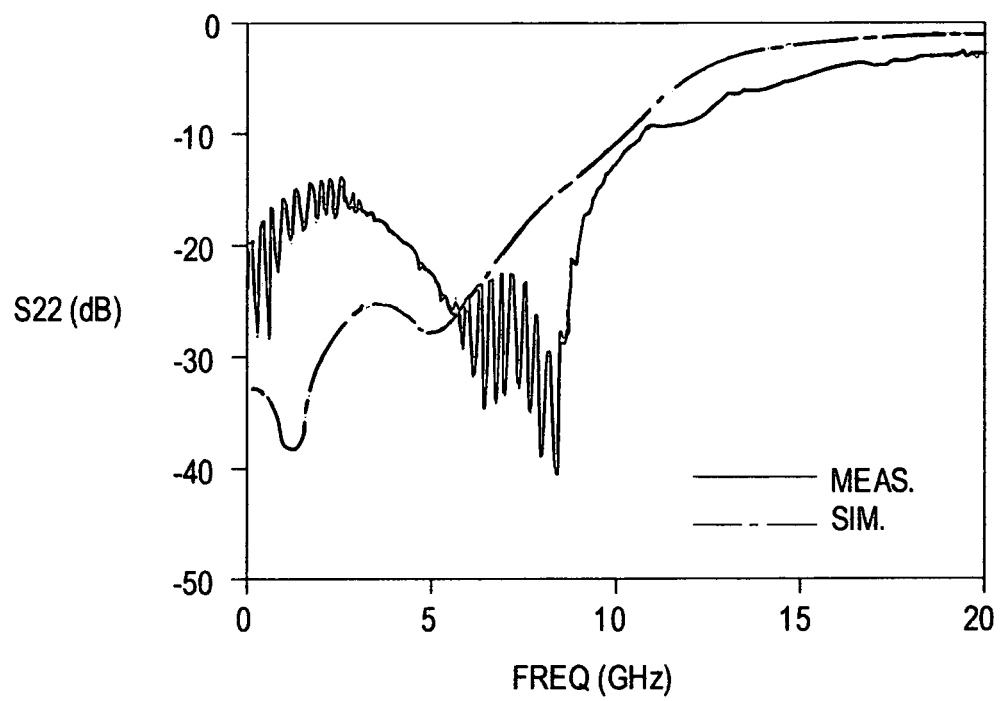

The frequency responses of both DA chips were measured via on-wafer probing. Due to the inaccuracy of on-chip capacitors and the modeling of inductor loss, there is a sloping response below 2 GHz. The gain of the Butterworth DA is 11.7 dB±0.6 dB from 2.5 GHz to 9 GHz, as shown in FIG. 7A for power gain. The phase response is shown in FIG. 7B. The input return loss is better than −17 dB within 8.5 GHz, as shown in FIG. 7C, and the output return loss is better than −14 dB within 9.3 GHz, as shown in FIG. 7C.

Figure 8A:
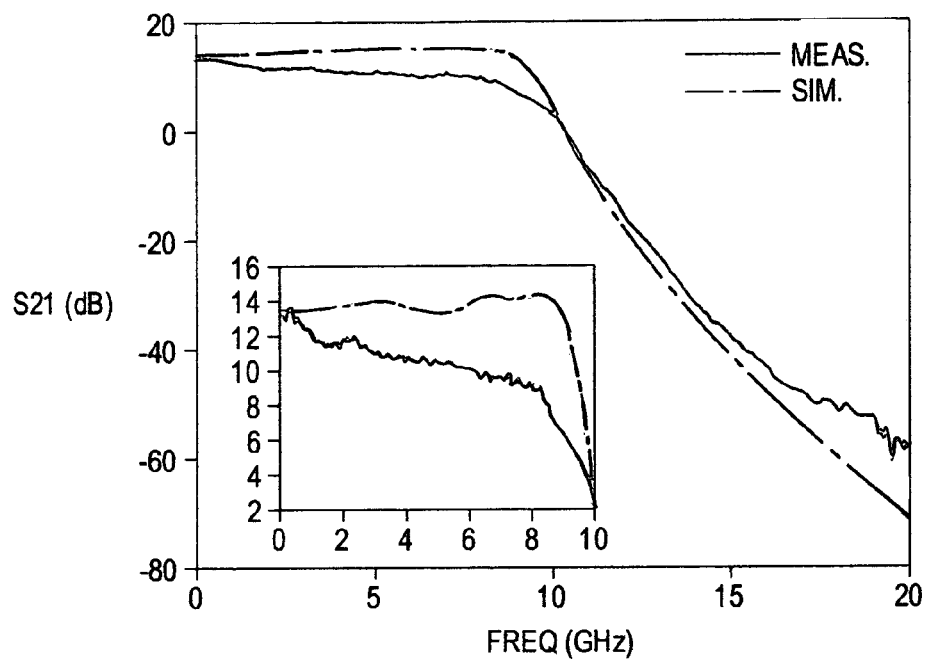
FIGS. 8A-8D are plots showing measured performance of the prototype of FIG. 6B.
Figure 8B:
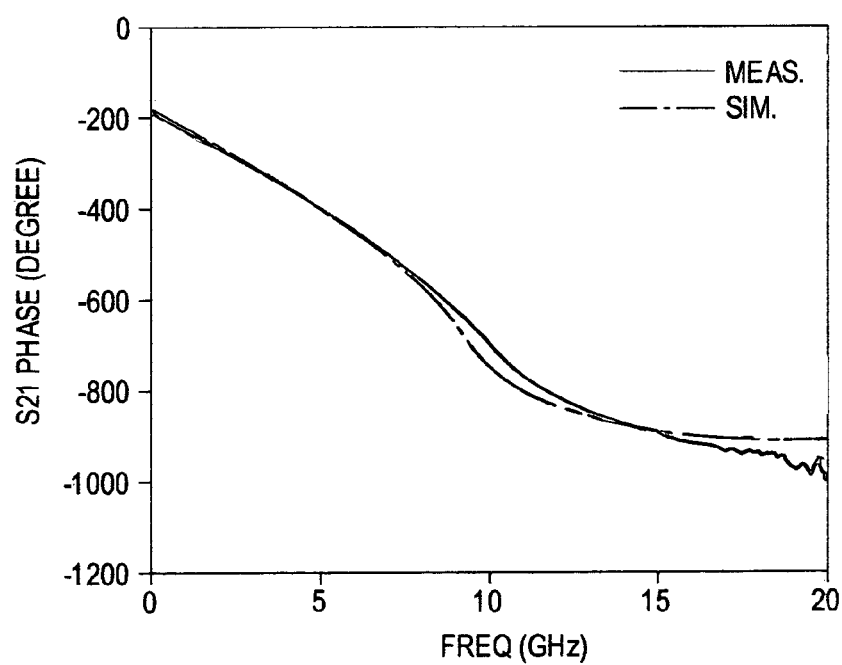
Figure 8C:
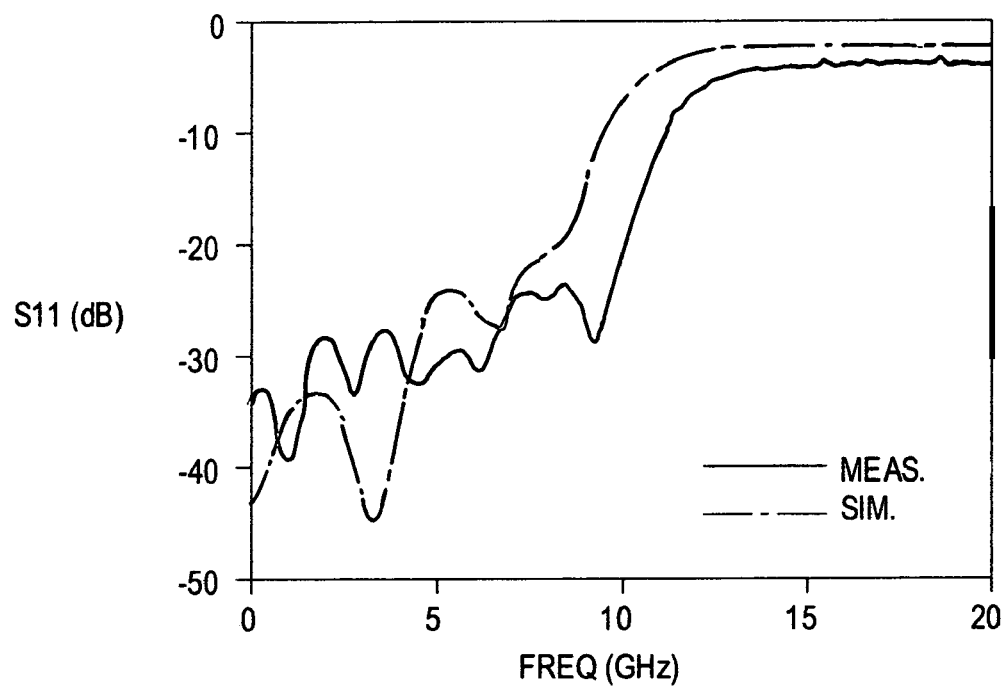
Figure 8D:
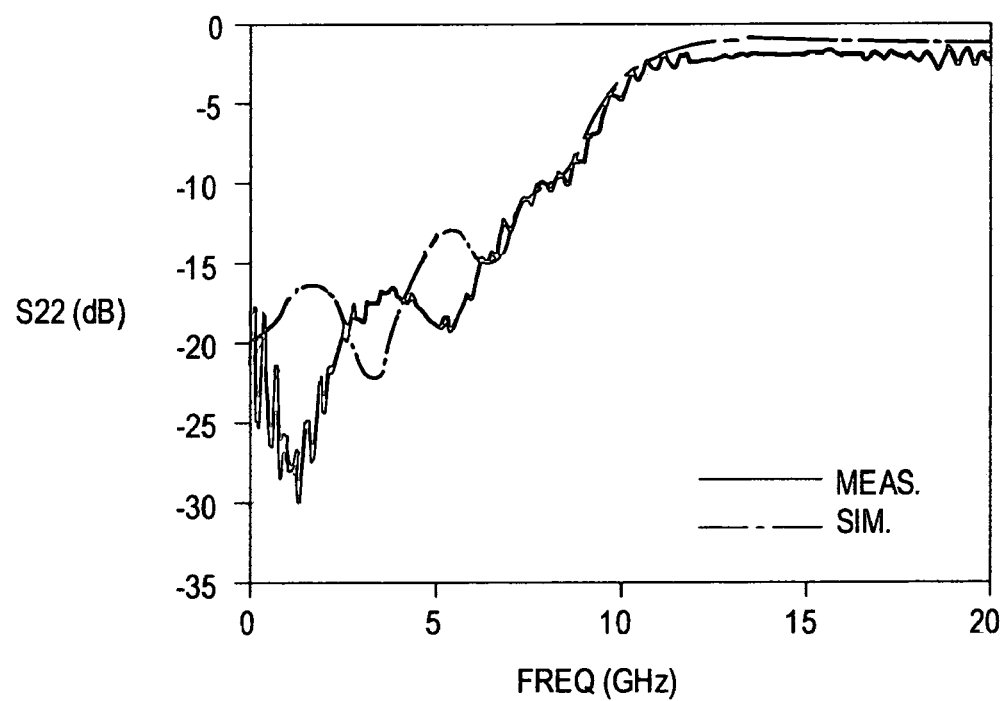

The small signal gain of the Chebyshev DA is 10 dB±1.0 dB from 2.5 GHz to 8.5 GHz, as shown in FIG. 8A. The phase response is shown in FIG. 8B. The input return loss is better than −11 dB within 9.6 GHz, as shown in FIG. 8C, and the output return loss is better than −10 dB within 8.6 GHz, as shown in FIG. 8D. The transition rate to the stop-band is −5 dB/GHz for the Butterworth DA and −8 dB/GHz for the Chebyshev DA. It can be seen that both prototypes match the simulation very well.

Figure 9:
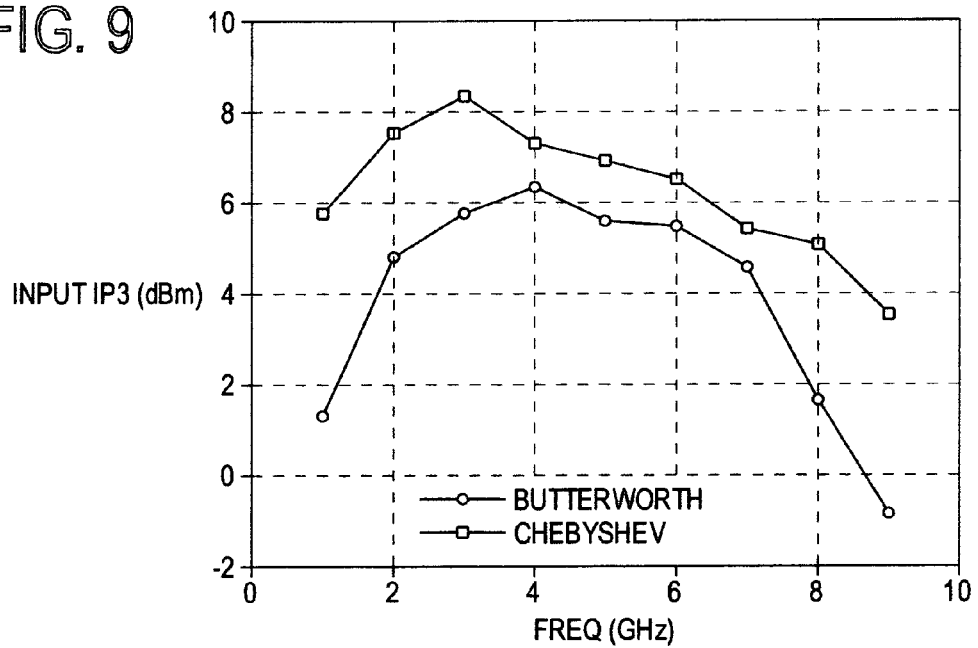
FIG. 9 is a plot showing the input IP3 of the prototypes of FIGS. 6A and 6B.

The nonlinearity performance of the DAs is also characterized and is shown in FIG. 9. The input IP3 of the Butterworth DA is better than 4.5 dBm from 2 GHz to 7 GHz. The Chebyshev one is better than 5 dBm from 1 GHz to 8 GHz.

Another embodiment will now be disclosed. This embodiment implements a filter for use in an partially analog transceiver.

Figure 10:
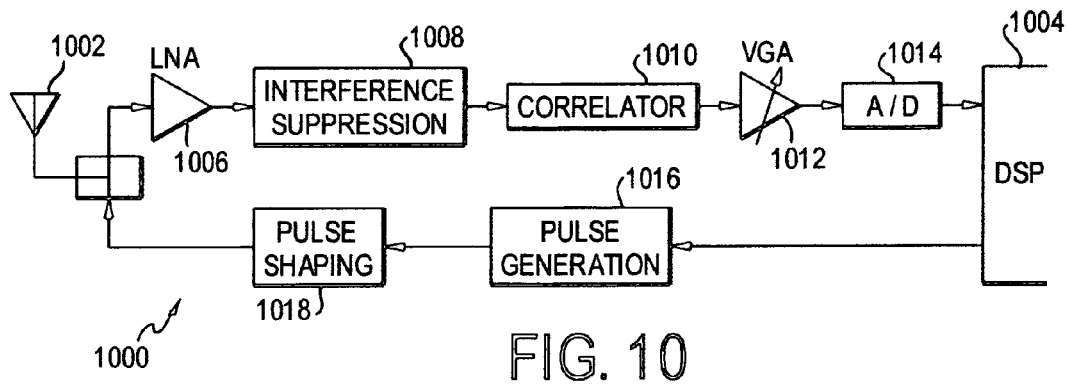
FIG. 10 is a block diagram of a transceiver incorporating a filter according to the second preferred embodiment.

A partially-analog receiver moves correlators to the analog domain, which can greatly reduce the speed requirement and power consumption of ADCs. FIG. 10 shows the block diagram of a proposed IR-UWB transceiver 1000. The following elements are provided between the antenna 1002 and the digital signal processor (DSP) 1004. A signal received by the antenna 1002 is amplified by a low-noise amplifier (LNA) 1006. An analog interference-suppression notch filter 1008 is inserted between the LNA 1006 and the correlator 1010. The signal then goes through a variable-gain amplifier (VGA) 1012 and an analog-to-digital (A/D) converter 1014. On the transmitter side, modulated UWB pulses produced by the pulse generation circuit 1016 are filtered by the pulse shaping filter 1018 so as to not only help meet the UWB transmission mask, but also introduce notches at specific interference frequencies. Both filters are now in analog domains. One or both of the interference suppression filter and the pulse shaping filter can implement the second preferred embodiment of the invention.

Linear transversal filters are good candidates for implementing these notch filters. In conventional spread spectrum systems, surface-acoustic wave (SAW) or charge-coupled devices (CCD) can be used to achieve bandwidth on the order of 100 MHz. In IR-UWB systems, these devices can no longer meet the speed requirement. On the other hand, microwave passive filters can operate at GHz frequency range, but they are usually not reconfigurable and also difficult to be integrated on-chip due to size limitations. The second preferred embodiment achieves pulse shaping and interference suppression functions using an integrated transversal filter, with both high-speed pulse processing capabilities and good reconfigurability.

Recent research has demonstrated that a distributed transversal filter (DTF) is suitable for multi-gigahertz signal processing such as equalization in 10 Gb/s fiber-optic systems and sub-nanosecond pulse synthesis. This motivated us to investigate using DTFs in UWB systems.

Figure 11:
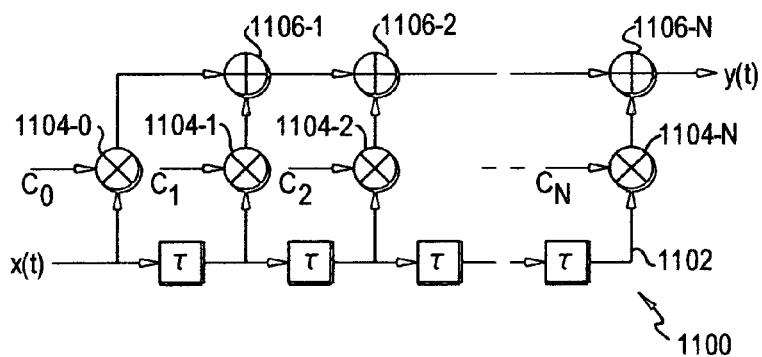
FIG. 11 is a block diagram of an FIR transversal filter.

In an FIR transversal filter, as shown in FIG. 11, as 1100, the input signal x(t) propagates along a delay line 1102. The signal x(t) and its delayed versions x(t−kτ) (where τ is the unit delay and k=1, . . . , N) are tapped along the delay line 1102, multiplied by the coefficients $c_k$ in multipliers (amplifiers) 1104-0, 1104-1, 1104-2, . . . , 1104-N and then summed in summation elements 1106-1, 1106-2, . . . , 1106-N to generate the filtered output y(t). This architecture is usually referred as tapped-delay-line structure. A distributed transversal filter (DTF) is essentially an analog FIR filter based on distributed circuit techniques, which are widely used in microwave, fiber-optical and radar systems.

Figure 12:
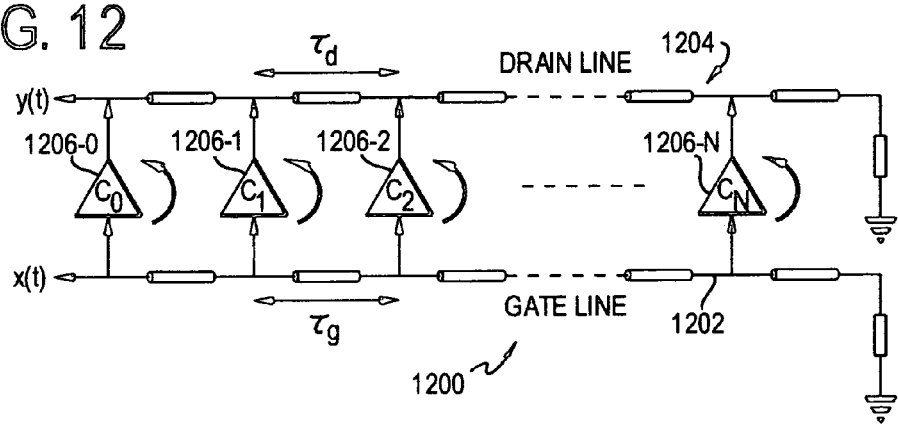
FIG. 12 is a circuit diagram of a distributed transversal filter according to the second preferred embodiment.

FIG. 12 shows the basic structure of a DTF 1200, which has two transmission lines, namely, a gate line 1202 and a drain line 1204, and multiple gain cells 1206-0, 1206-1, 1206-2, . . . , 1206-N coupled between them. The impedances 1208 on the right are the terminations on the transmission lines, usually matched to the characteristic impedance within the passband. The DTF 1200 can be viewed as a distributed amplifier operating in the reverse-gain mode, and therefore inherits the latter's unique wideband characteristics: the parasitic capacitance of transistors are absorbed into the loaded transmissions to form low-pass filtering structures. The circuit bandwidth is thus limited only by the cut-off frequency of the loaded transmission lines, and can be (by design) much larger than what is achievable by a lumped circuit.

Similarly to a generic transversal filter, the input signal in a DTF travels along the input transmission line (gate-line), and is tapped by each gain cell in sequence (from left to right in FIG. 12). The tapped signal is amplified by a variable gain, which corresponds to the filter coefficient (see below). Then the output signals from all cells are power-combined on the output transmission line (drain-line) and travel to the output (from right to left in FIG. 12). The input signal on the gate-line is eventually absorbed by the matched termination, and so are the signals traveling to the right on the drain-line. In this architecture, the loaded transmission lines serve both as signal distribution/combining networks and delay elements. The transfer function of an DTF can be described in the time domain as $$y(t) = \sum_{k=0}^{N} c_k x\left(t - \sum_{i=0}^{k-1}(\tau_{gi} + \tau_{di})\right)$$

where $c_k$ is the tap coefficient and is assumed to be real in a DTF. The quantities $\tau_{gi}$ and $\tau_{di}$ are the tap delays from the gate and drain lines. The delay between adjacent ones of the cells is the sum of the delays from both lines; that is, $\tau_i = \tau_{gi} + \tau_{di}$. Correspondingly, the frequency response is given by $$H(j\omega) = \sum_{k=0}^{N} c_k \exp\left(-j\omega \sum_{i=0}^{k-1} \tau_i\right)$$

For a typical DTF with uniform distributed gain cells, $\tau_i = \tau$, and $$H(j\omega) = \sum_{k=0}^{N} c_k \exp(-jk\omega\tau)$$

Apparently, the tap delay τ sets the sampling frequency of a DTF, and hence imposes another constraint on its frequency response in addition to the cut-off frequency of the loaded transmission lines. τ is determined by the transmission line design, and can be as small as tens of picoseconds using current integrated circuit technologies, which corresponds to multi-gigahertz bandwidth for the filter. The cut-off frequency tend to be higher than the sampling frequency. Therefore, an integrated DTF can be used in IRUWB systems for pulse shaping and interference suppression.

An integrated DTF has some distinctive advantages: 1) it can achieve much larger bandwidth with relatively low power consumption compared to a digital FIR filter. The latter has to be implemented in ultra-high-speed digital circuits, which consume comparable if not more power than a DTF, not to mention (again) the ultra-high-speed ADC needed to sample and quantize the pulse. 2) Compared to other analog transversal filters, transmission lines can be easily implemented on-chip, while CCD or SAW devices cannot. 3) The filter coefficients can be easily and independently controlled by gain cells, and thus it is inherently reconfigurable.

In order to generate target spectrum of UWB signals or suppress the NBI, a DTF needs to be synthesized for specific transfer functions in frequency domain. In general, the transfer function of a DTF is expressed above. If we assume the delay between adjacent cells are identical, the transfer function of a DTF can be expressed as the truncated Fourier expansion. Therefore, the basic design goal is to determine all the coefficients $c_k$ so that the synthesized function $H(j\omega)$ is the best approximation for a target response function. Let $G(j\omega)$ be a prescribed target transfer function, and only the magnitude response matters. The phase response is assumed to be linear which implies the coefficients distribution must exhibit symmetry relative to the center of the DTF.

Under the linear phase assumption, the coefficients can be determined as $$c_k = \frac{1}{\omega_s} \int_{\omega_1}^{\omega_2} |G(j\omega)| \exp(jk\omega\tau) d\omega$$

where $k=0, 1, \ldots, N/2$, $\omega_1$ and $\omega_2$ are the lower and upper bounds of the target frequency band, respectively, beyond which the magnitude of $G(j\omega)$ is considered to be zero. Because of the symmetry of the coefficients, $c_k = c_{N-k}$ for $k=N/2+1, \ldots, N$.

One desired function of using DTF in UWB signal pulse shaping is to generate a notch at specific frequencies, e.g. 2.4 GHz or 5 GHz, to mitigate those NBIs. In such a scenario, the notch frequency is critical and needs to be quite accurate. It can be proved that 3-tap DTF is adequate to generate one notch frequency. The transfer function of a 3-tap DTF is simply $$H(j\omega) = c_0 + c_1 \exp(-j\omega\tau) + c_2(\exp-j2\omega\tau)$$

The requirement $H(j\omega_0\tau)=0$ under the linear phase assumption yields $$\frac{c_0}{c_2} = 1$$
$$\frac{c_1}{c_2} = -2\cos(\omega_0\tau)$$

As can be seen from these two equations, the notch frequency tuning can be achieved by varying coefficient $c_1$ while keeping $c_0$ and $c_2$ identical to each other. In practical implementation, coefficients $c_k$ always have an upper bound limited by device and power consumption. Thus, even though in the analysis above both $c_0$ and $c_1$ are normalized to $c_2$, the coefficient which has maximum absolute value should be selected as the unit vector and all other coefficients should be normalized to it. In general, an (N+1)-tap DTF may generate N/2 notch frequencies.

Another desired function of UWB pulse shaping is to generate a particular notch shape. If three frequency points are selected to define the notch shape, one defines the notch frequency, the other two define the notch width. A 7-tap DTF is necessary to generate such a particular notch because an (N+1)-tap DTF with real coefficients can accurately control the responses at N/2 discrete frequency points.

Figure 13A:
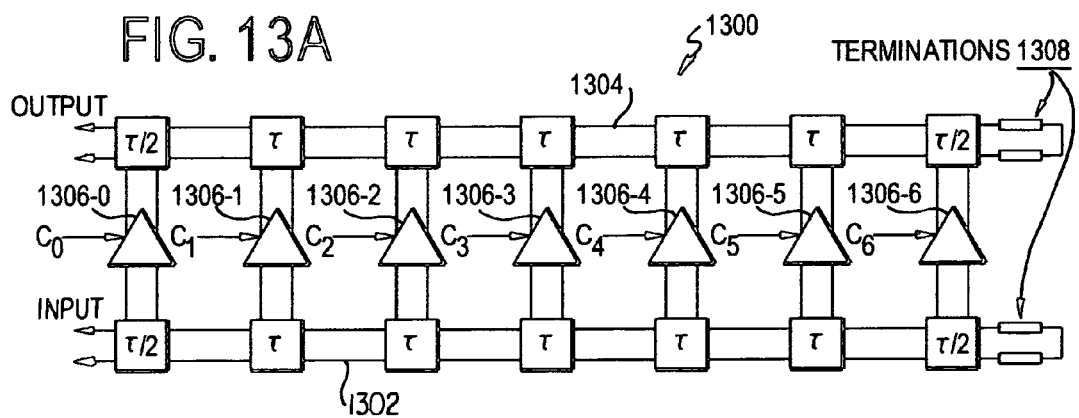
FIGS. 13A-C are circuit diagrams of a prototype filter according to the second preferred embodiment.

The schematic of a prototype 7-tap DTF is shown in FIG. 13A as 1300. It consists of 7 gain cells 1306-0, 1306-1, 1306-2, 1306-3, 1306-4, 1306-5, 1306-6 coupled between two differential LC artificial transmission lines 1302, 1304 having terminations 1308. As in any distributed circuit, the design of transmission lines is of critical importance. In the case of DTFs, an additional constraint is the time delay between adjacent taps, τ. For this prototype, τ is specified as 50 ps, i.e., a sampling frequency of 20 GHz, which is adequate for synthesizing the frequency response within 10 GHz bandwidth. The total delay of the transmission lines would determine the temporal length of DTF's impulse response, which corresponds to the frequency domain resolution. Considering these constraints, the delay elements were implemented using LC ladders constructed using spiral inductors and metal-insulator-metal (MIM) capacitors. The inductance and capacitance values are determined according to delay and bandwidth requirements. The transistor size in each gain cell is selected properly to give desired input capacitance value.

Figure 13B:
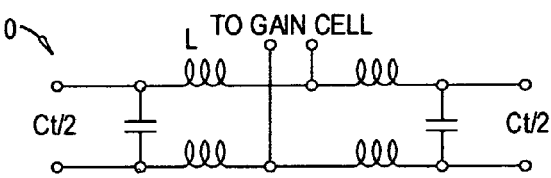

The configuration of an LC section is shown in FIG. 13B as 1310. The MIM capacitors $C_t$ are added to meet both the delay and bandwidth requirements. The input capacitance of the gain cells is absorbed into the transmission line structure, and become part of the LC ladder.

Figure 13C:
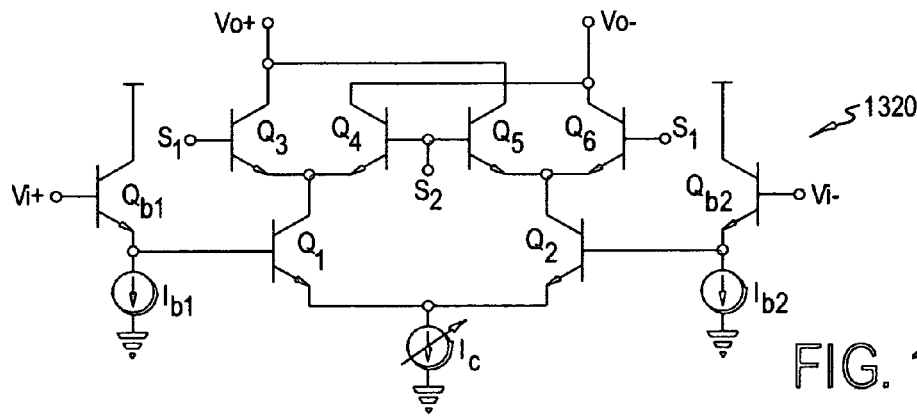

FIG. 13C shows the simplified schematic of the gain stage 1320. The core of the circuit is a Gilbert cell ($Q_1$ to $Q_6$). The absolute value of the filter coefficients ($c_0, c_1, \ldots c_6$) is implemented using the tunable tail current source $I_c$. The sign of the coefficient is implemented using two differential pairs ($Q_3, Q_4, Q_5$ and $Q_6$) to steer the differential current from $Q_1$ and $Q_2$ to the output transmission lines. The control signals of these transistors ($S_1$ and $S_2$) are analog voltages ($V_{on}$ and $V_{off}$) selected by a single digital bit (S), which represents the sign of the corresponding coefficient. Because the output nodes are always connected to the collector of an .ON. transistor and that of an .OFF. transistor, there is no variation in the loading of the output transmission lines when the sign of the coefficient is switched. The differential input signals are buffered using emitter followers ($Q_{b1}, Q_{b2}, I_{b1}$ and $I_{b2}$). Buffering reduces the loading and thus improves the linearity of the phase response on the input transmission lines.

Figure 14:
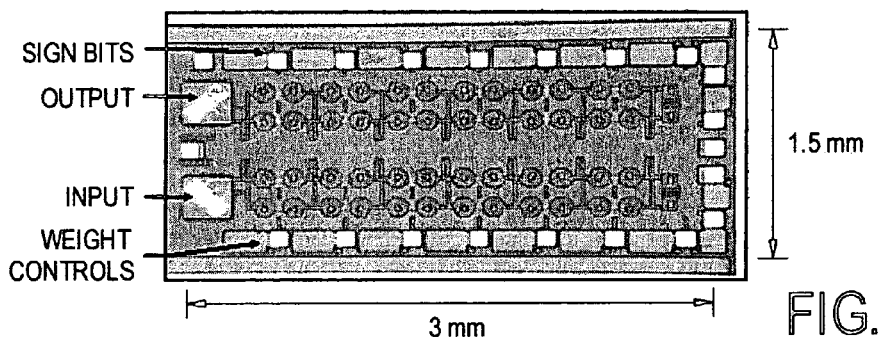
FIG. 14 is a micrograph of the prototype.

The 7-tap prototype DTF was designed and fabricated using a 0.18 μm. SiGe BiCMOS process with $f_T$ of 120 GHz. FIG. 14 shows the chip micrograph of the chip 1400. Chip size is 3 mm×1.5 mm, including pads, and the area for each tap is about 0.3 mm×0.9 mm. The DC pads on the top are for sign bits of weights, and the bottom ones are for absolute values of coefficients. The terminations are implemented with multiple resistors in parallel, which can be laser-trimmed to fine-tune the matching properties. The power supply voltage is 3 V.

Figure 15A:
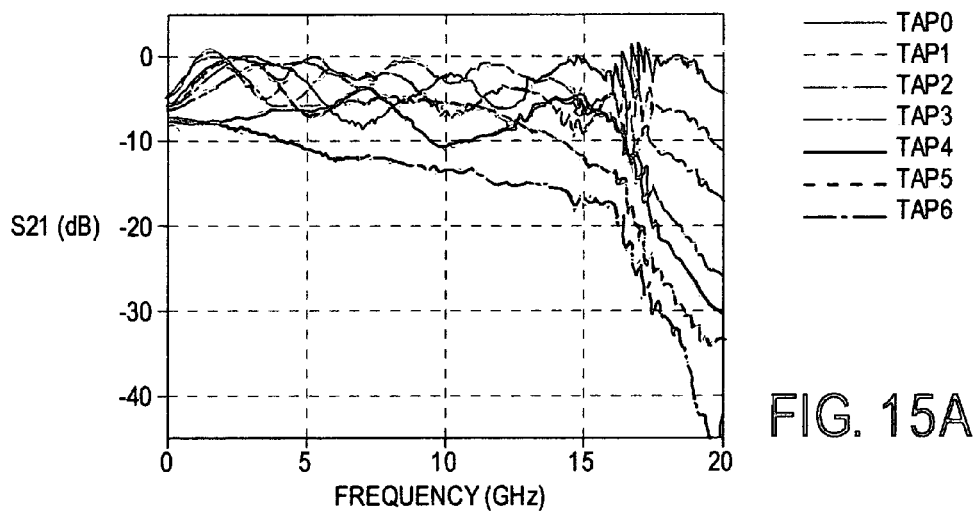
FIGS. 15A and 15B are plots of frequency responses of the prototype.
Figure 15B:
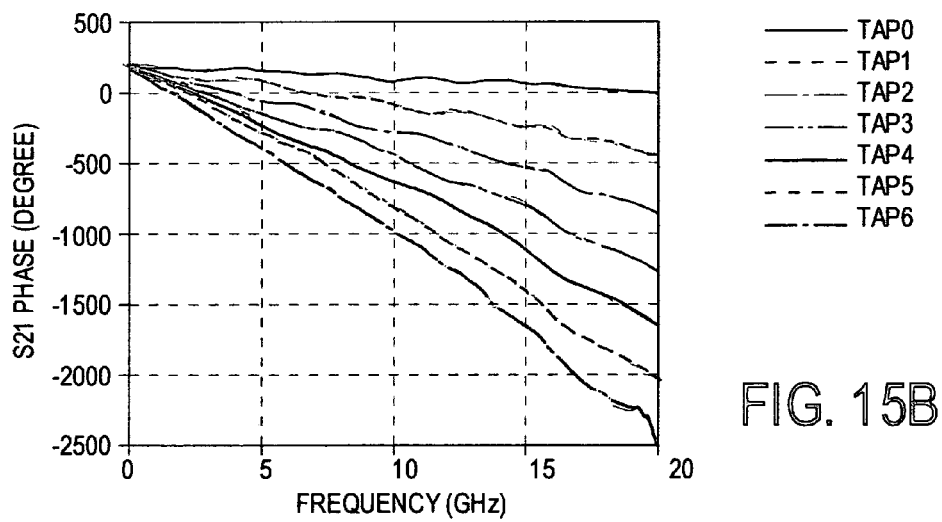

The characterization of the prototype DTF was performed in the frequency domain via on-wafer probing. Four-port s-parameters are measured and converted to differential s-parameters. The differential s-parameters are shown in FIGS. 15A for magnitude and 15B for phase. The insertion loss of tap0 is −3 dB and reasonably flat within 15 GHz bandwidth. The insertion loss and the bandwidth decrease gradually from tap0 to tap6 since the signal travels longer distance on the LC lines. The phase responses are fairly linear.

Figure 16A:
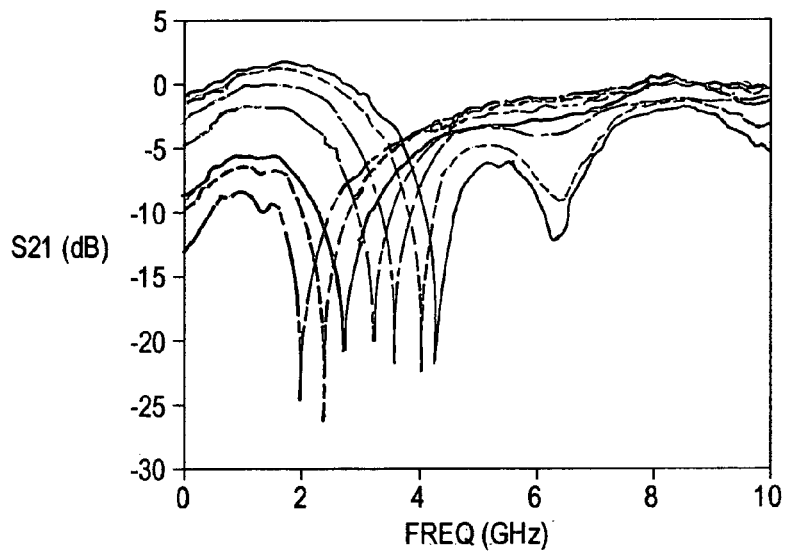
FIGS. 16A-C are plots of notch frequency tuning.
Figure 16B:
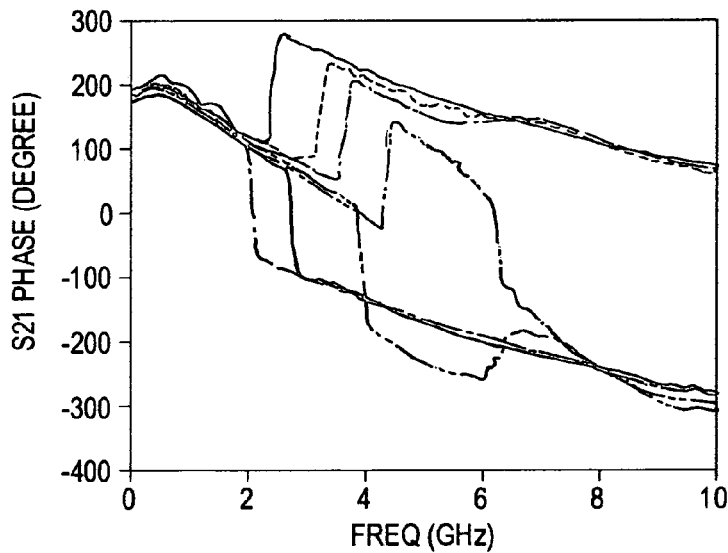
Figure 16C:
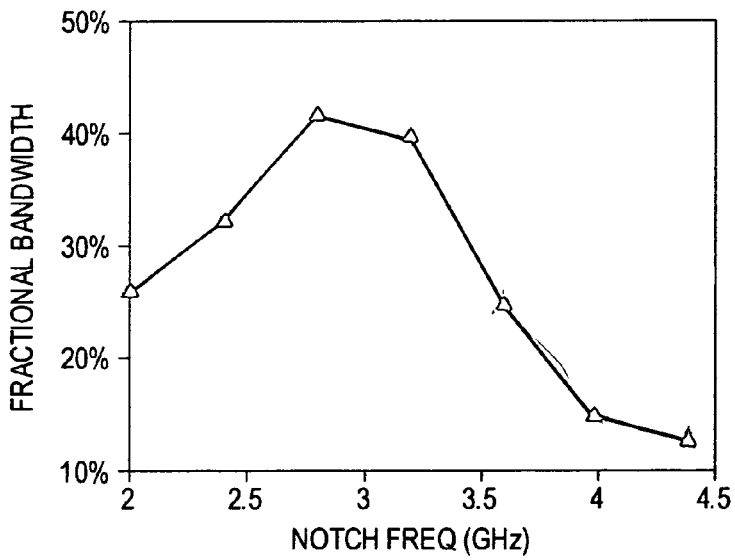

FIGS. 16A-16C show the notch generation, which clearly demonstrates the reconfigurability of a DTF in terms of notch frequency tuning. The notches are generated using three taps (tap0,1,2) from 2 GHz to 4.4 GHz continuously, even though a step of 0.4 GHz is shown. The corresponding tail bias currents $I_c$ for each tap are shown in the inset table. The (+) and (−) represent the signs of coefficients. As seen in Table I below, the sign of $Ic_1$ shows that coefficient $c_1$ changes from negative to positive as notch frequency increases, which is compliant with previous analysis results. In the phase responses, these is always a $\pi$ phase jump at the notch frequency. This is because that notch in S21 response is actually a transmission zero. As frequency increases and passes by the zero, the phase response should have an abrupt change of $\pi$. The fractional bandwidth of each generated notch is shown in FIG. 16C. Since insertion loss values in two passbands are different, the lower one is used as the reference and −3 dB bandwidth is used to calculate the fractional bandwidth.

TABLE I

Notch Generation

| Notch frequency | $I_{c0}$ (mA) | $I_{c1}$ (mA) | $I_{c2}$ (mA) |
|---|---|---|---|
| 2.0 GHz | (+)1.72 | (−)2.20 | (+)1.66 |
| 2.4 GHz | (+)1.83 | (−)2.10 | (+)1.72 |
| 2.8 GHz | (+)1.60 | (−)1.80 | (+)1.48 |
| 3.2 GHz | (+)2.18 | (−)1.92 | (+)1.72 |
| 3.6 GHz | (+)2.18 | (−)1.18 | (+)1.78 |
| 4.0 GHz | (+)1.97 | (+)1.10 | (+)2.01 |
| 4.4 GHz | (+)1.73 | (+)1.28 | (+)2.20 |

Figure 17A:
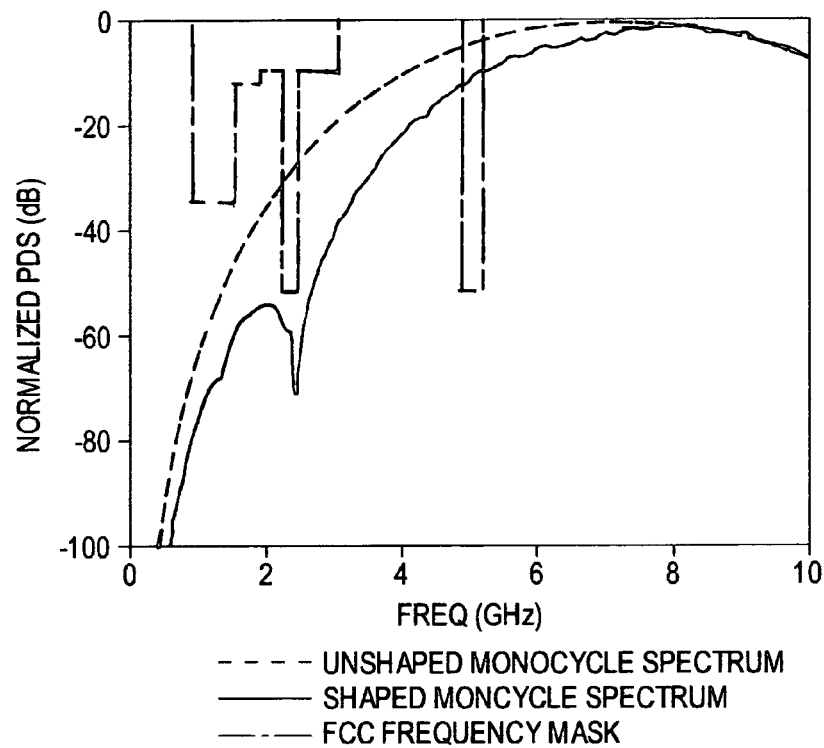
FIGS. 17A, 17B, 18A and 18B are plots of shaped frequency responses and pulses.
Figure 17B:
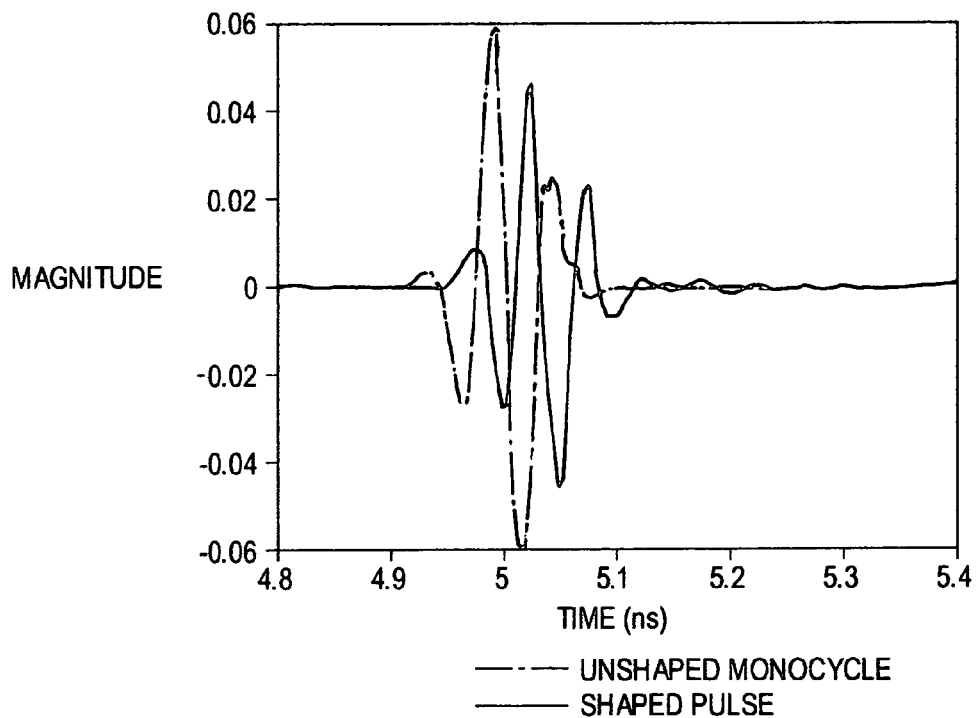
Figure 18A:
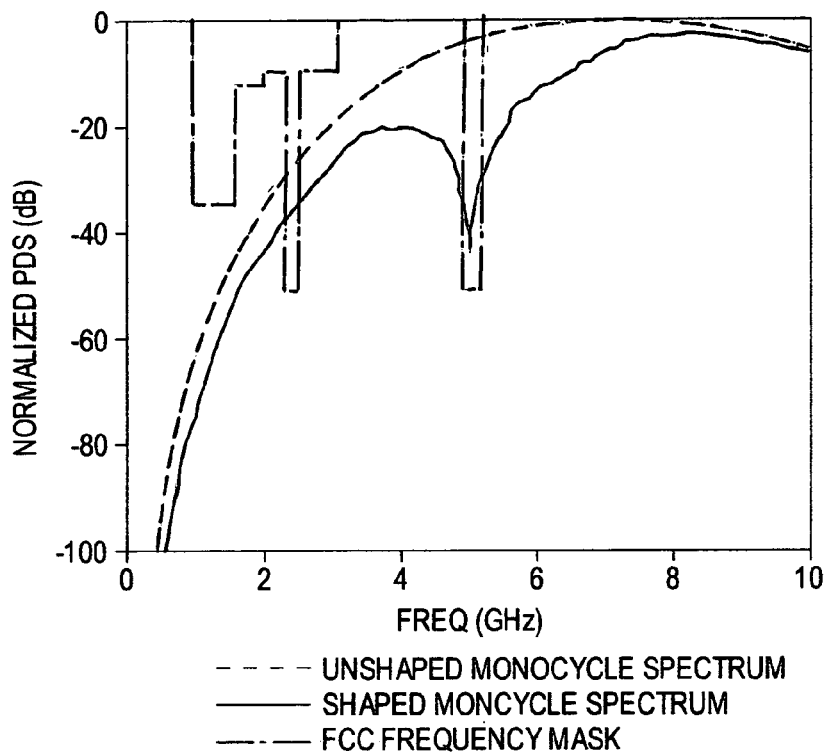
Figure 18B:
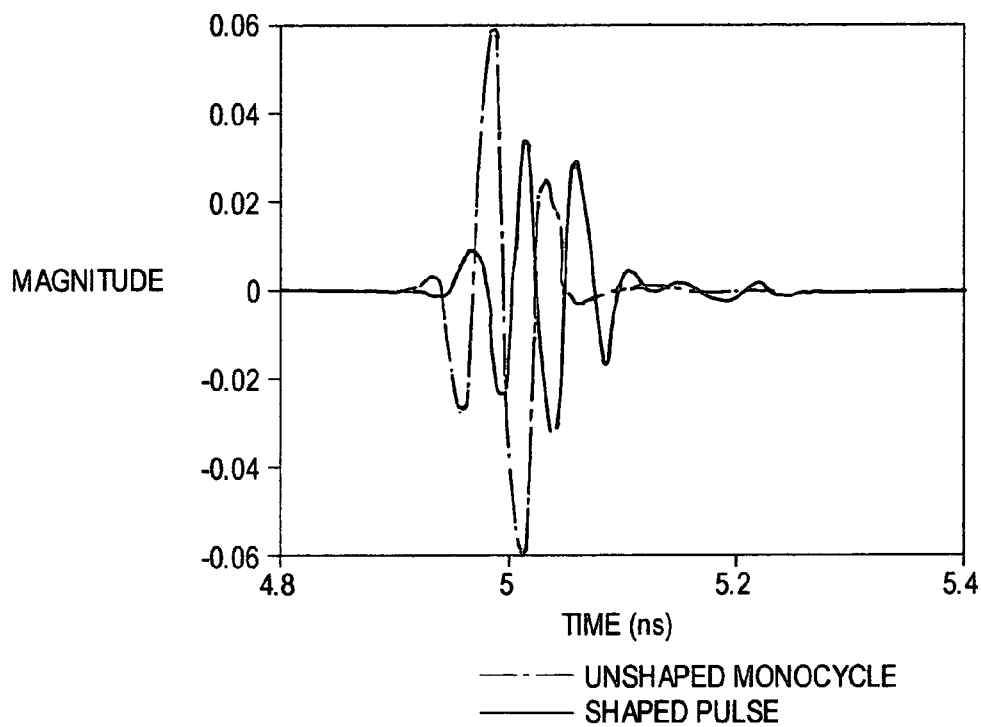

The pulse shaping capability is demonstrated using two example spectra. FIG. 17A shows the spectrum of a Gaussian fifth-order monocycle and the corresponding spectrum after filtering using a DTF whose synthesized frequency response has a notch at 2.4 GHz. The unshaped and shaped pulses are shown in FIG. 17B. The pulse duration is preserved after shaping because of DTF's linear phase response. The power consumption needed for this response is 30.2 mW. The similar scenario is shown FIGS. 18A and 18B using a DTF whose synthesized frequency response has a notch at 5 GHz. The power consumption needed for this response is 30.8 mW.

Figure 19A:
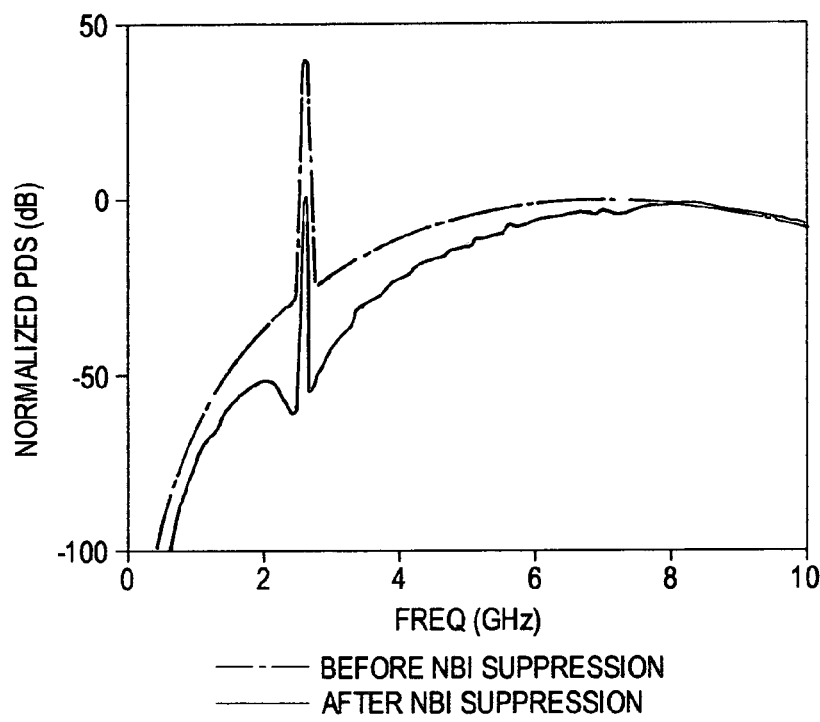
FIGS. 19A, 19B, 20A and 20B are plots of NBI suppression.
Figure 19B:
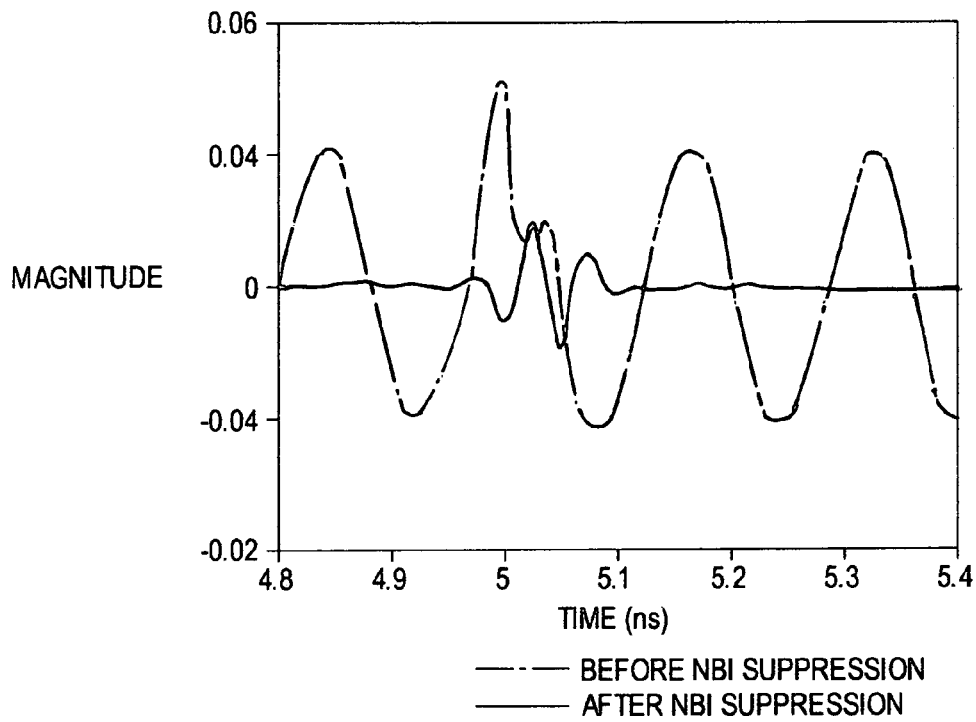
Figure 20A:
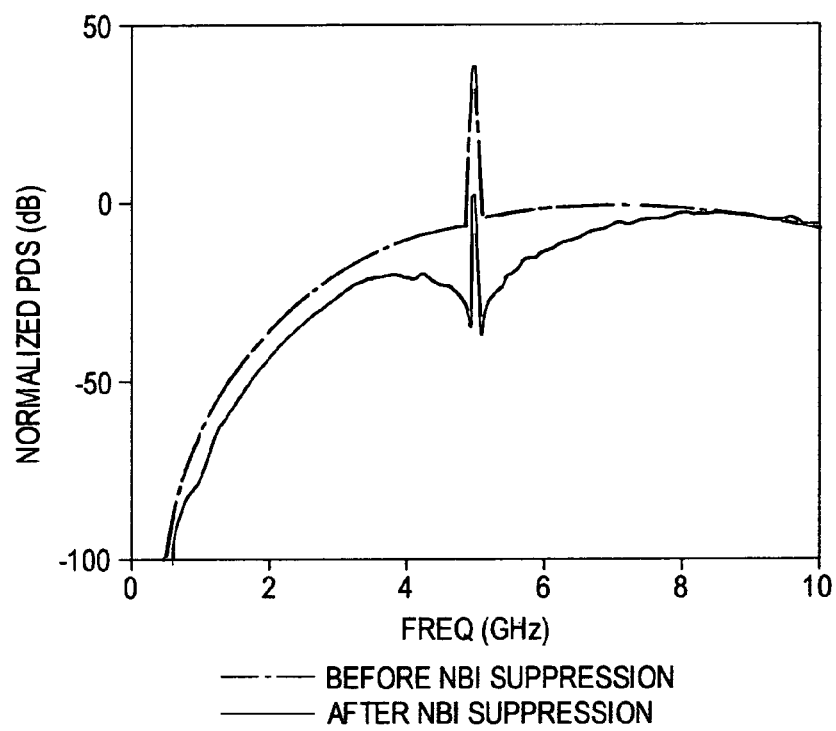
Figure 20B:
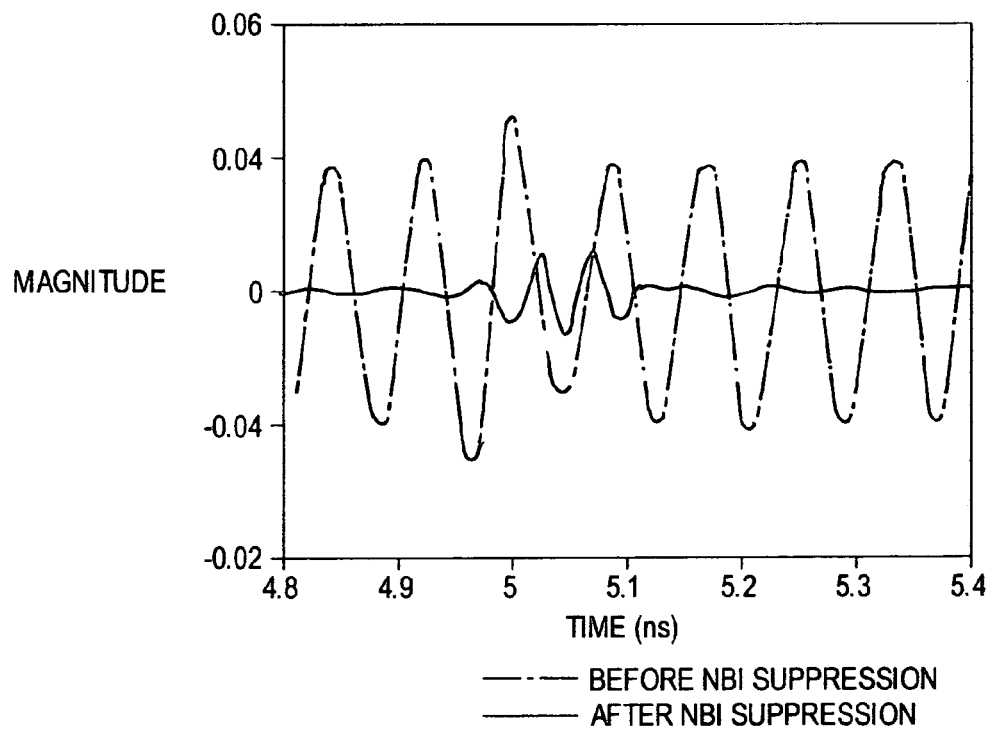

The NBI suppression is also demonstrated using two examples. FIG. 19A shows the spectrum of a Gaussian fifth-order monocycle with 2.4 GHz narrow-band interference before and after the NBI suppression. About 40 dB suppression can be achieved using the prototype DTF. The time domain signals are shown in FIG. 19B, in which the UWB pulse is totally distorted by 2.4 GHz interference before NBI suppression, and it is recovered very well after passing the DTF. The similar scenario is shown in FIGS. 20A and 20B with 5 GHz narrow-band interference. The bias conditions are the same as in the pulse shaping case.

Figure 21:
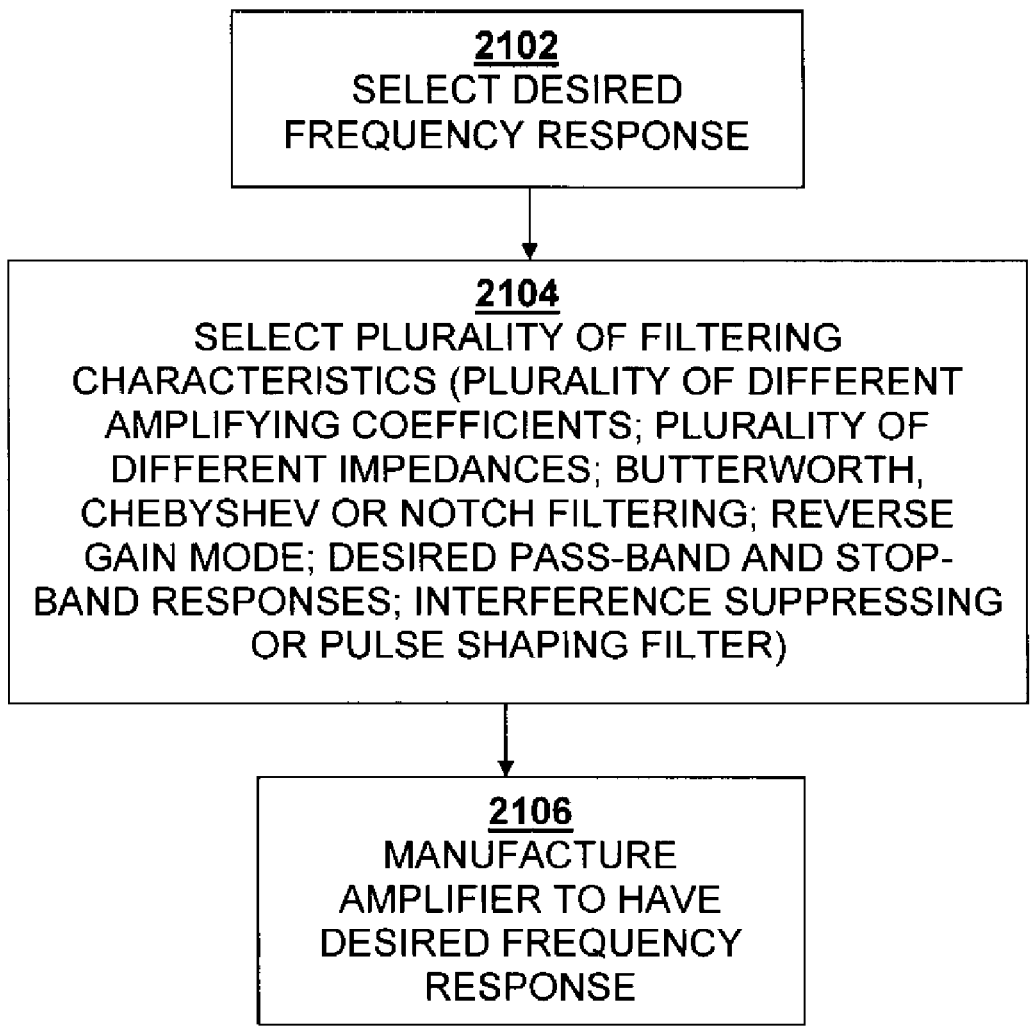
FIG. 21 is a flow chart showing a method of designing and manufacturing a distributed amplifier.

A distributed amplifier according to the preferred or any other embodiment may be designed and manufactured as shown in the flow chart of FIG. 21. In step 2102, the desired frequency response is selected. In step 2104, the plurality of filtering characteristics which provide the desired frequency response, as described elsewhere herein, are selected. In step 2106, the distributed amplifier is manufactured to have the desired frequency response.

While preferred embodiments have been set forth above, those skilled in the art who have reviewed the present disclosure will readily appreciate that other embodiments can be realized within the scope of the invention. For example, fabrication techniques other than CMOS technology can be used. Also, numerical values such as the number of stages are illustrative rather than limiting. Therefore, the present invention should be construed as limited only by the appended claims.

We claim:

1. A distributed amplifier comprising:
   a gate line for propagating an input signal;
   a drain line for propagating an output signal; and
   a plurality of filter elements, in spaced relation along the gate line and the drain line, for receiving the input signal, filtering the input signal to output filtered signals, and outputting the filtered signals to the drain line, wherein the plurality of filter elements have a plurality of different filtering characteristics, and wherein the plurality of different filtering characteristics comprise a plurality of different amplifying coefficients.

2. The distributed amplifier of claim 1, wherein the plurality of different filtering characteristics further comprise a plurality of different impedances.

3. The distributed amplifier of claim 1, wherein the plurality of different filtering characteristics are selected to implement Butterworth filtering.

4. The distributed amplifier of claim 1, wherein the plurality of different filtering characteristics are selected to implement Chebyshev filtering.

5. The distributed amplifier of claim 1, wherein the plurality of different filtering characteristics are selected to implement notch filtering.

6. The distributed amplifier of claim 1, wherein the plurality of different filtering characteristics are selected to cause the distributed amplifier to operate in reverse gain mode.

7. A method for designing and manufacturing a distributed amplifier comprising:
   a gate line for propagating an input signal;
   a drain line for propagating an output signal; and
   a plurality of filter elements, in spaced relation along the gate line and the drain line, for receiving the input signal, filtering the input signal to output filtered signals, and outputting the filtered signals to the drain line, wherein the plurality of filter elements have a plurality of different filtering characteristics;
   the method comprising:
   (a) selection a desired frequency response for the distributed amplifier;
   (b) selecting the plurality of filtering characteristics which provide the desired frequency response; and
   (c) manufacturing the distributed amplifier to have the desires frequency response.

8. The method of claim 7, wherein the desired frequency response comprises a desired pass-band response and a desired stop-band response.

9. The method of claim 7, wherein the plurality of different filtering characteristics comprise a plurality of different amplifying coefficients.

10. The method of claim 7, wherein the plurality of different filtering characteristics comprise a plurality of different impedances.

11. The method of claim 7, wherein the plurality of different filtering characteristics are selected to implement Butterworth filtering.

12. The method of claim 7, wherein the plurality of different filtering characteristics are selected to implement Chebyshev filtering.

13. The method of claim 7, wherein the plurality of different filtering characteristics are selected to implement notch filtering.

14. The method of claim 7, wherein the plurality of different filtering characteristics are selected to cause the distributed amplifier to operate in reverse gain mode.

15. A transceiver comprising:
an antenna;
a signal processor; and
circuitry connecting the antenna with the signal processor, the circuitry comprising a distributed amplification filter, the distributed amplifier comprising:
a gate line for propagating an input signal;
a drain line for propagating an output signal; and
a plurality of filter elements, in spaced relation along the gate line and the drain line, for receiving the input signal, filtering the input signal to output filtered signals, and outputting the filtered signals to the drain line, wherein the plurality of filter elements have a plurality of different filtering characteristics, and wherein the plurality of different filtering characteristics comprise a plurality of different amplifying coefficients.

16. The transceiver of claim 15, wherein the filter is an interference suppression filter.

17. The transceiver of claim 15, wherein the filter is a pulse shaping filter.

18. The transceiver of claim 15, wherein the filter is a notch filter.

19. The transceiver of claim 15, wherein the filter operates in reverse gain mode.

* * * * *